United States Patent [19]

Heanue et al.

[11] Patent Number: 5,740,184

[45] Date of Patent: Apr. 14, 1998

[54] DECISION FEEDBACK VITERBI DETECTOR FOR PAGE-ACCESS OPTICAL MEMORIES

[75] Inventors: John F. Heanue, San Mateo; Korhan Gürkan, Palo Alto; Lambertus Hesselink, Woodside, all of Calif.

[73] Assignee: The Board of Trustees of the Leland Stanford Junior University, Palo Alto, Calif.

[21] Appl. No.: 625,561

[22] Filed: Apr. 1, 1996

[51] Int. Cl.⁶ .................................................. G11C 13/04
[52] U.S. Cl. ........................................ 371/30; 365/215
[58] Field of Search ............................... 371/30; 365/215

[56] References Cited

U.S. PATENT DOCUMENTS

| | | | |
|---|---|---|---|
| 5,132,988 | 7/1992 | Fisher et al. | 375/233 |
| 5,430,661 | 7/1995 | Fisher et al. | 364/488 |
| 5,543,978 | 8/1996 | Park | 360/65 |
| 5,572,503 | 11/1996 | Satoh et al. | 369/124 |

OTHER PUBLICATIONS

Burkhardt, "Optimal Data Retrieval for High Density Storage", VLSI and Computer Peripherals, 1989 Proceedings, pp. I-43 to I-48, Dec. 1989.

Primary Examiner—Stephen M. Baker
Attorney, Agent, or Firm—Lumen Intellectual Property Services

[57] ABSTRACT

Signal processing methods for addressing intersymbol interference in page-access optical memories such as holographic or two photon systems are disclosed. The invention takes advantage of the cartesian arrangement of data in page-access optical memories. A detector using the Viterbi algorithm is used to decode data row by row. Decision feedback is used in the direction perpendicular to the Viterbi direction. The use of data from previously decoded rows allows a reduction in the complexity of the Viterbi detector.

23 Claims, 9 Drawing Sheets

DECISION FEEDBACK VITERBI DETECTOR FOR PAGE-ACCESS OPTICAL MEMORIES

FIELD OF THE INVENTION

The present invention relates to the field of optical page-access data storage, and in particular to a decoding method using the Viterbi algorithm and decision feedback.

BACKGROUND—DESCRIPTION OF PRIOR ART

Page access optical memories are being investigated as candidates for the next generation of digital storage devices, due to their potential for simultaneously achieving high capacity, fast transfer rates, and short access times. Page-optical memories include holographic storage systems, two-photon 3-D optical memories, and systems using spectral hole burning. For more information on spectral hole burning, see for example the article by Maniloff et al. in *Appl. Opt.* 34: 4140–4148 (1995), while for a description of a two-photon optical memory see the article by Hunter et al. in *Appl. Opt.* 29: 2058–2066 (1990). For information on holographic memory systems, see for example the articles by Heanue et al. in *Science* 265: 749–752 (1994), Hong et al. in *Opt. Eng.* 34(8): 2193–2203 (1995), and Psaltis and Mok in *Scientific American* 273(5): 70–78 (1995), or U.S. Pat. No. 4,927,200 (Hesselink et al.).

An underlying reason for the fast performance of page-access optical storage systems is that thousands of data bits are stored together in pages, rather than individually on a track. Data is input and output in parallel on a page-by-page basis. High capacity is achieved through the storage of many data pages in a common volume.

The following description will focus on a holographic memory system. It should be recognized, however, that the noise problems and solutions discussed are applicable to other optical page-access data storage systems. Briefly, in a typical volume holographic storage system data is stored in a photorefractive medium such as a lithium niobate (LiNbO$_3$) or strontium barium niobate (SBN) crystal. The data is encoded as a page in a coherent signal beam that is allowed to interfere with a coherent reference beam within the recording medium; the interference pattern corresponding to a page is stored throughout the medium. For readout, only the reference beam is sent through the medium, and the interaction of the reference beam with the stored interference pattern produces a signal beam (reconstructed image) proportional to the beam used to store the pattern.

Figure 1:
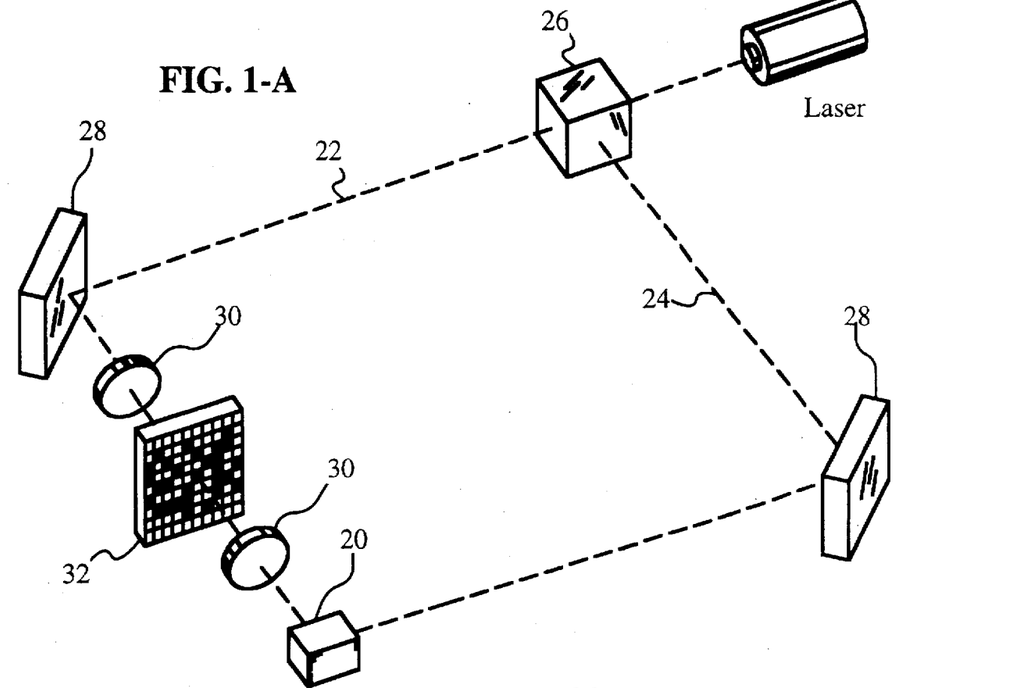

FIG. 1 is a schematic perspective view of a typical setup used for holographic data storage. Data is stored in a holographic medium 20 as an interference pattern produced by a signal beam 22 and a reference beam 24. Optical components such as a beam splitter 26, mirrors 28 and lenses 30 can be used to manipulate the laser beams. The data is encoded in signal beam 22 using an Amplitude Spatial Light Modulator (ASLM) 32. ASLM 32 selectively allows light to pass through its light pixels. The data is read using a camera 34, as shown in FIG. 1-B. Camera 34 is typically a CCD array.

A multiplexing technique such as angular, spatial or phase-code multiplexing can be used to store multiple pages in a medium such as 20. The number of pages stored in a given medium is limited, however, by photorefractive crosserasure between the pages. In memories based on holographic recording in photorefractive media, the diffraction efficiency of a given hologram decreases as the square of the number of multiplexed pages. Thus, given a minimum allowed diffraction efficiency, increasing the storage capacity of a system can be achieved through an increase in the amount of data stored per page. Page sizes on the order of one million pixels are needed to make holographic storage competitive with other data storage techniques.

Increasing the data content per page is faced with several obstacles, however. One such obstacle is the increase in intersymbol interference (ISI) that accompanies a reduction in pixel size. Ideally, each data bit corresponds to one pixel of ASLM 32, which in turn is imaged one-to-one onto a pixel of camera (CCD array) 34. In an ideal system, there is no ISI, and the value of the decoded bits corresponding to camera pixels can be determined optimally using bit-by-bit threshold detection. In practice, imperfections in the optical elements used, or any misalignment between the reconstructed image and CCD array 34 result in interpixel crosstalk (an example of ISI). An optimal detector in a system with ISI has to take into account sequences of pixels, rather than individual pixels. Accounting for ISI allows the use of large data pages, and also allows relaxing the design tolerances of the optical components used in the storage system.

Figure 2:
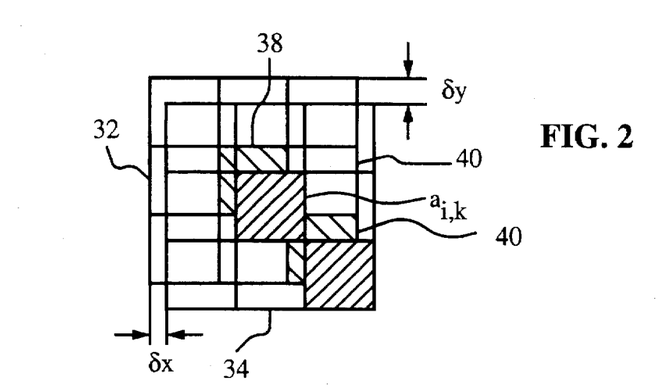
FIG. 2 illustrates the misalignment of input and readout pixels, according to the present invention.

FIG. 2 illustrates schematically interpixel crosstalk due to misalignment between the pixels of the reconstructed image (the image of the pixels of ASLM 32) and the pixels of CCD array 34, for $\delta_x$, $\delta_y$ less than the pixel size. Misalignment can occur for example as a result of a shift in the position of the crystal, camera or optical elements between encoding and readout. The value read at a pixel $a_{i,k}$ of CCD array 34 depends not only on the corresponding pixel 38 of the reconstructed image, but also on the pixels 40 surrounding pixel 38. Optical defocusing, aberrations, or blooming at the CCD array also result in intersymbol interference. In turn, ISI leads to an increase in the bit error rate (BER) for the system.

OBJECTS AND ADVANTAGES OF THE INVENTION

In light of the above, it is a primary object of the present invention to provide a method of decoding data from an optical page access memory in the presence of ISI. It is another object of the present invention to provide a page access optical storage system with a reduced BER. It is yet another object of this invention to provide a page-access optical storage system allowing looser tolerances on its optical components. It is yet another object of this invention to provide a detection method having reduced computational complexity.

SUMMARY OF THE INVENTION

The present invention discloses signal processing methods for addressing intersymbol interference in page-access optical memories such as holographic or two photon systems. The invention takes advantage of the cartesian arrangement of data in page-access optical memories. A detector using the Viterbi algorithm is used to decode data row by row. Decision feedback is used in the direction perpendicular to the Viterbi direction. The use of data from previously decoded rows allows a reduction in the complexity of the Viterbi detection.

Preferably, each page is divided into smaller sections having substantially uniform transfer functions. The transfer function for each section can be determined empirically, either by including reference bits in each section, or by including a reference page with the stored data pages.

BRIEF DESCRIPTION OF THE DRAWINGS

FIG. 1-A is a perspective view of a typical arrangement for a holographic data storage system.

FIG. 1-B is a top view of a system similar to the one shown in FIG. 1-A.

FIG. 3-A shows a sequence of bits, a corresponding sequence of two-bit states, and possible two-bit states, according to the present invention.

FIG. 3-B shows a sequence of bits, a corresponding sequence of three-bit states, and possible three-bit states, according to the present invention.

FIG. 6-A shows a two-dimensional set of bits including two-dimensional states, according to the present invention.

FIG. 6-B illustrates the reduction in state size accompanying the use of decision feedback in a Viterbi detector, according to the present invention.

FIG. 9-A shows the BER in a holographic memory as a function of relative pixel displacement in the x-direction, according to the present invention.

FIG. 9-B shows the BER in a holographic memory as a function of relative pixel displacement in the negative (downward) y-direction, according to the present invention.

FIG. 9-C shows the BER in a holographic memory as a function of relative pixel displacement in the positive y-direction, according to the present invention.

FIG. 9-D shows the BER in a holographic memory as a function of relative pixel displacement in both x and y directions, according to the present invention.

FIG. 13-A is a histogram of detected light intensities for a reconstructed image aligned with the detection array, according to the present invention.

FIG. 13-B is a histogram of detected light intensities for a reconstructed image misaligned with the detection array, according to the present invention.

DESCRIPTION

In the following discussion, for some quantity A, the notation $A_k$ is understood to correspond to some (fixed) k, while the notation $\{A_k\}$ is understood to mean a set of $A_k$ having varying values of k. Likewise, $A[k,j]$ is understood to imply that both k and j are fixed, while $\{A[k,j]\}$ is understood to mean a set of $A[k,j]$, where at least one of the indices k or j is varying. The notation $\{A[k1,j]\}$ is understood to mean a set of $A[k1,j]$ for a fixed k1 and varying j.

The present invention uses the observation that a holographic digital storage device can be thought of as a communications system in which data is transmitted and received. Thus, signal processing methods developed for communications can be adapted to address apparently unrelated problems in data storage devices.

Signal processing methods originally used in communications applications have been recently applied to magnetic recording media. Briefly, in typical magnetic media data is recorded as sequences of bits on circular tracks. A bit is encoded in a portion of the magnetic medium magnetized in a particular direction. As the bits are brought closer together, the magnetic field lines from bits adjacent to a bit of interest affect the readout signal from the bit of interest, and ISI results. An important point about magnetic recording media is that a bit is geometrically aligned only with respect to adjacent bits on the same track, and not with respect to bits on adjacent tracks.

VITERBI ALGORITHM (VA)

A number of methods developed to address ISI in communications applications make use of the Viterbi algorithm (VA). For examples of magneto-optical systems making use of the Viterbi algorithm for decoding, see e.g. U.S. Pat. Nos. 5,488,591 and 5,363,352. For a detailed treatment of the Viterbi algorithm and examples of its applications see e.g. the article by Forney in *IEEE Proc.* 61: 268–278 (1973), which is herein incorporated by reference, or Chapter 7 of *Communications Systems Engineering* by Proakis and Salehi, Prentice Hall, Englewood Cliffs, N.J., 1994, p. 484–488.

The following discussion will describe first a one-dimensional data storage system, and then will address the extension of the problem to two dimensions. A one-dimensional system can include for example a SLM and a camera, each using a single row of pixels. The discussion of a one-dimensional system will consider bits as the symbols being stored; it is evident that non-binary data can also be stored in a page-access optical system.

In a page-access optical storage system data is accessed page-by-page. It is convenient, however, to think of the data as being read-out sequentially: at each time $t_k$ a signal $r_k$ corresponding to a stored data bit $b_k$ is read out, and a corresponding value is assigned to a decoded bit $d_k$. In an ideal system, the value assigned to $d_k$ is determined directly from $r_k$: $r_k$ is thresholded, and $d_k$ is assigned a 1 if $r_k$ exceeds the threshold, and 0 otherwise. The term "determined directly," as used herein, is understood to mean that a value is assigned to $d_k$ through processing steps (such as thresholding) performed only on $r_k$, independently of other signals. In practice, in systems with ISI, $r_k$ depends on bits other than $b_k$, as illustrated in FIG. 2.

Figure 3:
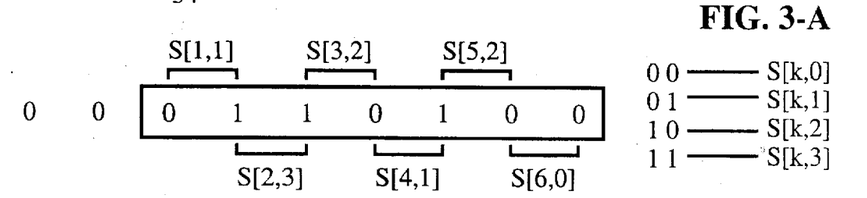

One can define test states $\{S[k,j]\}$ corresponding to a test bit sequence $\{s_k\}$, where k specifies a position in the sequence and j specifies the bit content of a state. Each test state $S[k,j]$ contains a test bit $s_k$ and additional test bits $s_{k+z}$; test bits $s_{k+z}$ correspond to bits $b_{k+z}$ whose value may influence the signal $r_k$. If a small misalignment (less than the size of one pixel) is the sole source of ISI, it is sufficient to consider only $z=\pm 1$. A sequence of bits $\{s_k\}$ can then be represented by a sequence of states $\{S[k,j]\}$. FIG. 3-A illustrates a sequence of states $S[1,j]$–$S[6,j]$ corresponding to a sequence of bits $s_1$–$s_7$. The sequence $\{s_k\}$ is boxed-in, and can be thought to be flanked by long sequences of zeros. Each state shown in FIG. 3-A comprises two bits; thus, there are $2^2=4$ possible values j for each k, as shown in FIG. 3-A. FIG. 3-B illustrates a sequence of states $\{S[k,j]\}$ comprising three bits each; in this case, there are $2^3=8$ possible values of j for each k. The state numbering shown in FIG. 3-B is such that a bit $s_k$ is the middle bit of the corresponding state $S[k,j]$; clearly, other state numbering schemes are possible.

Figure 4:
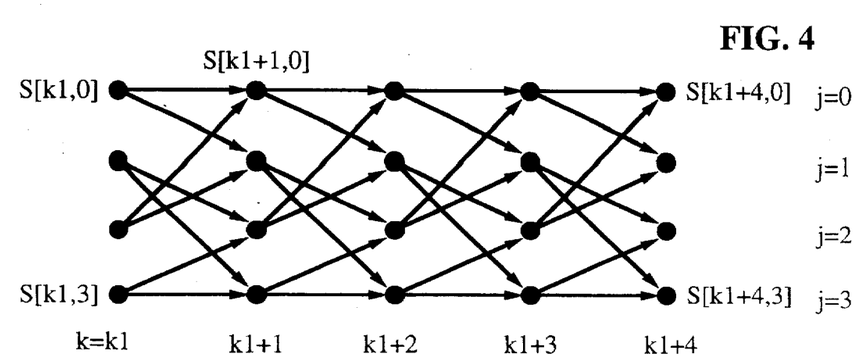
FIG. 4 shows a trellis and paths along the trellis, according to the present invention.

A sequence of states can be represented as a path p along a trellis, where each node of the trellis is a state. FIG. 4 shows a trellis and paths representing sequences of two-bit states. Each path p defines a unique value j=p(k) for each value of k. A sequence of states corresponding to a path p can then be represented as {S[k,p(k)]}.

The states in the trellis having a given value of k form a stage of the trellis. Each stage contains $m=2^n$ states, where n is the number of bits per state. A given state S[k,j] can only be followed by a subset of all the possible states {S[k+1,j]}, as illustrated by the arrows in FIG. 4. For example, the state 01 (j=1) can only be followed by 10 (j=2) or 11 (j=3), while the state 10 can only be followed by 00 (j=0) or 01.

Assigning values $\{d_k\}$ to decoded bits is then equivalent to determining a most likely path q from a set of possible paths {p}, given a sequence R of observed values $\{r_k\}$. The ideal sequence detector will choose the data sequence D of test bits $\{s_k\}$ that maximizes the conditional probability $$P(R|D) = P(r_1, \ldots, r_K | s_1, \ldots, s_K), \quad [1]$$

where K is the total number of bits in the sequence. Clearly, determining the optimal sequence of test bits $\{s_k\}$ is equivalent to determining the optimal sequence of test states {S[k,j]}.

In the following discussion, noise not due to ISI (additive noise) will be addressed separately from noise due to ISI. If the additive noise is assumed to be uncorrelated, the probability P can be expressed as $$P(R|D) = \prod_{k=1}^{K} P(r_k | s_{k-(L/2)}, \ldots, s_{k+(L/2)}), \quad [2]$$

where L is the intersymbol memory length, or the number of additional bits $b_{k+z}$ that affect a signal $r_k$ corresponding to a bit $b_k$. If a signal $r_k$ can only depend on bits adjacent to $b_k$ in the one-dimensional system described above, L=2. For ISI due to aberrations or defocusing, it may be necessary to take L to be larger than 2.

As can be seen from eq. [2], each observed value $r_k$ is only compared to the sequence of L+1 bits $s_{k-L/2}, \ldots, s_{k+L/2}$, which sequence in turn determines a path in a trellis such as the one shown in FIG. 4. Thus, the detection problem can be expressed as finding the path through the trellis that maximizes the product $$P(R|D) = \prod_{k=1}^{K} P(r_k | t_{k,p(k)}), \quad [3]$$

where $t_{k,p(k)}$ is the signal output for the $k^{th}$ stage of the path p, in the absence of additive noise, but in the presence of ISI. If one makes the further assumption that the additive noise is Gaussian, the probability density function in equation [3] can be written as $$P(r_k | t_{k,p(k)}) = \frac{1}{\sqrt{2\pi}\sigma} \exp\left(-\frac{(r_k - t_{k,p(k)})^2}{2\sigma^2}\right), \quad [4]$$

where $\sigma^2$ is the variance of the additive noise. By inserting equation [4] into equation [3] and taking the logarithm, it can be seen that the optimal path q is the one that minimizes $$M_p(R) = \sum_{k=1}^{K} (r_k - t_{k,p(k)})^2, \quad [5]$$

where $M_p(R)$ is the metric of the system. It is clear that in general, the optimal path q is the one having an optimal value of the system metric; for the metric above, the optimal value if the minimal value. The metric $M_p(R)$ shown in Eq. [5] is the Euclidean distance between the received sequence R and the ideal sequence of outputs for a path p. Clearly, other metrics can be used, particularly if the noise in the system does not fit the above assumptions.

For a one-dimensional sequence of K bits, there are $2^K$ possible paths through the corresponding trellis. For large values of K, it is impractical to evaluate all possible paths through the trellis. The Viterbi algorithm relies on an observation that allows the number of evaluated paths to increase linearly (rather than exponentially) with K.

Consider all possible paths p[k1,j1] entering a given state S[k1,j1], each of the paths having an associated metric $M_{p[k1,j1]}(R)$. Define a survivor path $p^{(s)}[k1,j1]$ as the path p[k1,j1] with the smallest metric. Any subsequent survivor path $p^{(s)}(k1+w,j1)$ entering a state S[k1+w,j] and passing through S[k1,j1] will then be a concatenation of $p^{(s)}[k1,j1]$ with another path leaving S[k1,j1]. Thus, for a stage k1 of a trellis of two-bit states, it is only necessary to retain the m survivor paths $\{p^{(s)}[k1,j]\}$, rather than the $m2^{k1-1}$ paths entering the states {S[k1,j]}.

It was empirically observed that, with very high probability, all survivor paths $\{p^{(s)}[k1,j]\}$ at a stage k1 will be identical in bit positions k1–5L and below. That is, for w≥5L the magnitude of a signal $r_{k1+w}$ will not affect which of the survivor paths $\{p^{(s)}[k1,j]\}$ is also part of the survivor paths $\{p^{(s)}[k1+w,j]\}$. This observation allows assigning values to decoded bits $\{d_k\}$ before all the signals $\{r_k: k=1 \ldots K\}$ are read out; symbol decisions are simply made with a 5L delay with respect to the signal sequence. For example, consider a one-dimensional system with L=2 and a signal sequence $r_1, \ldots, r_{12}$, with a state S[k,j] containing test bits $s_{k-1}$, $s_k$ and $s_{k+1}$ (see FIG. 3-B). Then, with high probability all the survivor paths $\{p^{(s)}[11,j]\}$ will pass through the same test state S[1,j1]. The decoded bit $d_1$ is then assigned the value $s_1.j_1$.

The preceding discussion applies in large part to two-dimensional systems as well, with the distinction that the test states {S[k,j]} are now sequences of two-dimensional "symbols," each symbol containing several test bits $\{s_{i,k}\}$. For a treatment of the Viterbi algorithm in the context of two-dimensional magnetic disk storage systems with off-track interference, see e.g. the article by Burkhardt "Optimal Data Retrieval for High Density Storage," *Proc. IEEE Conf. VLSI and Microelectronic Applications in Intelligent Peripherals and their Interconnection Networks*, IEEE Comp. Soc. Press Washington, DC, 1989, p. 1/43–48, which is herein incorporated by reference.

Figure 5:
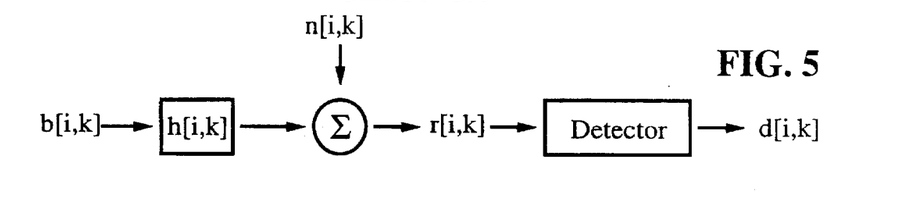
FIG. 5 is a flowchart illustrating the processing steps in a storage system with ISI, according to the present invention.

A model for a two-dimensional storage system is shown in FIG. 5. The signals $\{r_{i,k}\}$ read by the detector correspond to stored bits $\{b_{i,k}\}$ that have modified by a transfer function h[i,k], and to which noise n[i,k] has been added. If the system is linear and space-invariant, a two-dimensional function r[i,k] will be proportional to b[i,k]*h[i,k]+n[i,k], where the symbol * indicates the convolution operation. The detector deconvolves the signals and generates decoded bits $\{d_{i,k}\}$, ideally identical to the stored bits $\{b_{i,k}\}$.

In the absence of ISI, h[i,k] is represented by a 2-D delta function. If the transfer function is assumed to be finite, h[i,k] can be represented by a M×N matrix, where M and N are the extents of the transfer function in each dimension. A symbol can be defined as a column of bits with a height equal to the vertical extent of the transfer function. A state is then a sequence of symbols along the horizontal direction.

Figure 6:
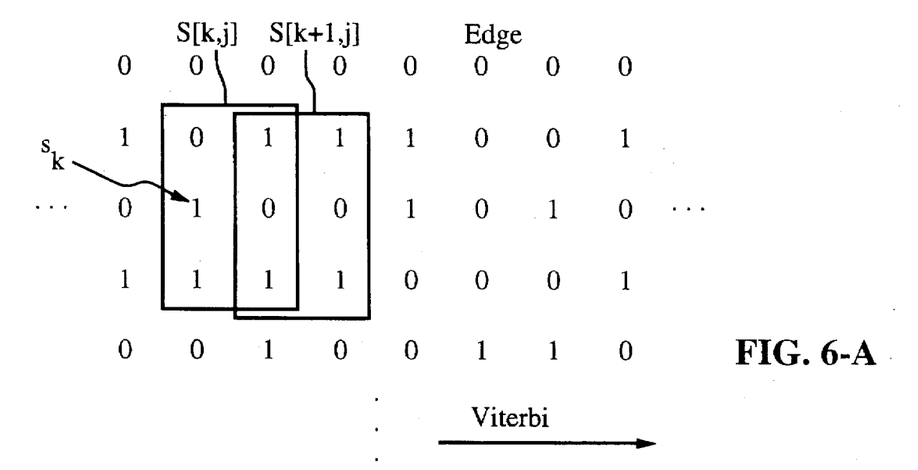

For simplicity, we will illustrate a system with a 3×3 transfer function, i.e. a system wherein the light intensity at a camera pixel depends on the corresponding SLM pixel as well as the surrounding eight SLM pixels. For a formal discussion of the extension of the Viterbi algorithm to two dimensions, see for example the above-mentioned article by Burkhardt. FIG. 6-A shows two states S[k,j] and S[k+1,j], where each state includes two consecutive symbols, and where each symbol consists of a column of three bits. There are 8 symbols in the symbol alphabet, and 64 possible states at each stage of the trellis. A given state S[k,j] can only be followed by eight (out of a possible 64) states S[k+1,j]. Each test state S[k,j] can be defined to be a C×D matrix comprising test bits $\{s_{c,d}\}$, where C is preferably equal to the number of rows (M) of the transfer function h, and D is preferably equal to N-1, where N is the number of columns of h. For a 3×3 transfer function, C=3 and D=2, as shown in FIG. 6-A.

A metric is computed for paths {p} according to equation [5], where $\{t_{k,p(k)}\}$ are determined using the 3×3 transfer function characterizing the ISI. The optimal path q then defines test bits $\{d_k\}=\{s_{k,q(k)}\}$. Viterbi detection progresses in the horizontal direction, as shown in FIG. 6-A. For each 3 bit symbol, the central bit is chosen as the detected data bit. Detection continues row-by-row until the entire page is decoded.

One problem with the above-described system is that the decoding is based on a progression of symbols in only one dimension; information about the symbol sequence in the vertical direction is not used. Another problem is that the large number of possible states and symbols results in a high-complexity detector. As shown above, even for a relatively small (3×3) transfer function, 64 survivor paths need to be computed and stored at each stage of the trellis.

DECISION FEEDBACK (DF)

Another method of addressing ISI is through decision feedback. Decision feedback exploits the fact that some of the bits affecting a sequence of signals are known bits. Known bits include previously decoded bits, reference bits, and fictitious bits outside the edges of a page. As shown in FIG. 6-A, fictitious bits outside the edges of a page can be taken to be zeros, since they do not affect the signal from edge bits. The effect of the known bits is subtracted out of a signal sequence $\{r_k\}$, if the transfer function for the system is known.

Consider for example a stored bit $b_k$ corresponding to a pixel $a_{i,k}$. The signal $r_k$ corresponding to $b_k$ depends on $b_k$ and also on neighboring bits. Consider a known bit f affecting the value of $r_k$. There is then a transfer factor $h(b_k,f)$ that measures the effect of f on $r_k$; the transfer factor is simply an element of the transfer function h. For example, if h is a 3×3 matrix and f corresponds to the pixel $a_{i-1,k}$ (i.e. the pixel above $a_{i,k}$), then $h(b_k,f)$ is equal to the element $h_{1,2}$. A processed signal $g_k$ is then obtained from $r_k$ by subtracting the effect of f on $r_k$, i.e. by subtracting from $r_k$ a transfer factor proportional to f and to $h(b_k,f)$. If f is the only bit besides $b_k$ affecting $r_k$, then a decoded bit $d_k$ is determined directly from $g_k$, for example by thresholding. The process can be repeated for all the known bits affecting $r_k$.

Decision feedback requires, as does a method using the Viterbi algorithm, that the transfer function for the system be known. For ISI due to transverse misalignment between a geometrically perfect reconstructed image and a perfect detection array (camera), the transfer function is uniform over a page. For ISI due to imperfections in optical components or rotation of the crystal or CCD array, however, the transfer function is not space-invariant across a page. It is preferred, therefore, that a page be divided into sections small enough that a transfer function can be approximated as uniform over a section. The sections are preferably read in parallel, each section having its own output channel fed to an independent detector.

Figure 7:
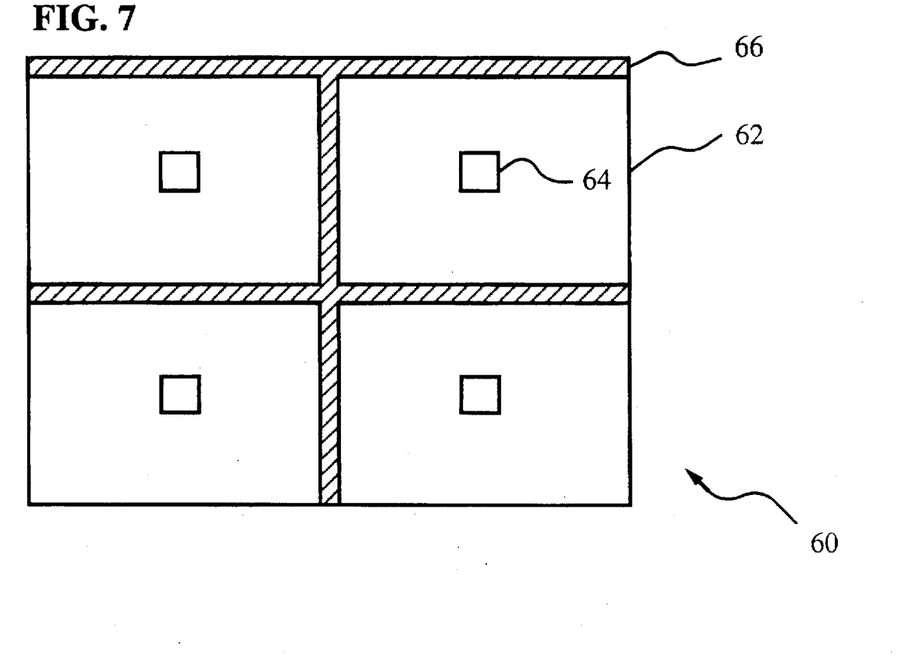
FIG. 7 shows a data page broken down into sections, according to the present invention.
Figure 8:
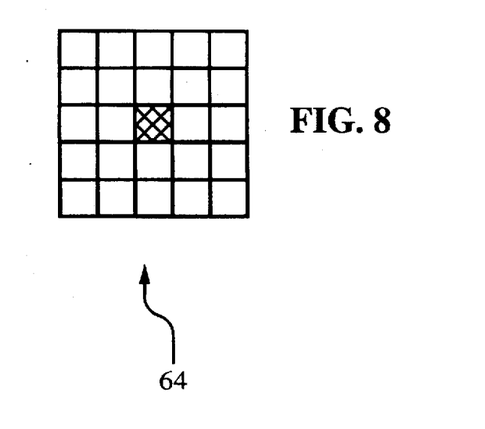
FIG. 8 shows a reference portion of a section such as the ones shown in FIG. 7, according to the present invention.

FIG. 7 shows a part of a page 60 comprising a section 62. Section 62 preferably includes at least one reference portion 64 and a buffer zone of known bits 66. In a preferred embodiment, section 62 comprises multiple reference portions such as 64. Reference portion 64 comprises reference (known) bits. For each section, the transfer function is determined by measuring the signals $\{r^{(Bi,k)}\}$ corresponding to reference bits $\{B_{i,k}\}$. For example, if h is taken to be 3×3, it is sufficient to consider a 5×5 square of 25 bits $\{B_{i,k}\}$, with all $\{B_{i,k}\}$ being zero except for the bit $B_{i1,k1}$ at the center of the square (see FIG. 8). In the absence of ISI, $r_{i1,k1}$ should be the only non-zero signal of the $\{r_{i,k}\}$. In the presence of ISI, some of the $\{r_{i,k}\}$ will be non-zero for i≠i1, k≠k1. A transfer coefficient $h(B_{i2,k2},B_{i1,k1})$ is then equal to $r^{(Bi2,k2)}/r^{(Bi1,k1)}$. The collection of nine transfer coefficients $h(B_{i,k},B_{i1,k1})$ forms the 3×3 transfer function for that section.

It is possible to establish a table of ideal outputs $\{t_{k,p(k)}\}$ without explicitly computing a transfer function; this can be done by storing a reference page containing all the possible transitions between states {S[k1,j1]} and {S[k1+1,j2]} (for all j1, j2), which is equivalent to storing all possible combinations of bits in a M×N box. In the case of a 3×3 transfer matrix, there are 64 states and 8 possible transitions from each state. Thus, all possible transitions in such a case can be described by using 64×8=512 pixels, i.e. by storing all possible combinations of bits in a 3×3 box. The reference page may contain multiple reference portions, each portion corresponding to a section of data; each portion then has its own table of ideal outputs.

VITERBI DETECTION WITH DECISION FEEDBACK (DF-VA)

Data in a holographic page is stored as a two-dimensional array. That is, it is known with a high degree of confidence that adjacent pixels are well aligned along two directions. The good alignment of the interfering symbols makes possible a detection method that would not be suitable for non-cartesian data storage media such as magnetic disks, where interfering bits are only aligned along a track, and not between different tracks.

Such a detection method uses Viterbi detection along one direction, and decision feedback along the perpendicular direction. Consider a set of stored (unknown) bits $\{b_k\}$ corresponding to pixels $\{a_{i,k}\}$, and a row of known bits $\{f_k\}$ corresponding to pixels $(a_{i+v},k)$, v≠0. In a preferred embodiment, v=±1, i.e. the row of known bits is just above (or below) the row of bits to be decoded. The known bits $\{f_k\}$ can be previously decoded bits, or can be all zeros if i=1 and v=-1. The effect of $\{f_k\}$ is subtracted from the signals $\{r_k\}$ corresponding to $\{b_k\}$, and $\{b_k\}$ are then decoded using Viterbi detection as described above.

An advantage of DF-VA is that by using information about the progression of data in the vertical direction, the BER is improved as compared to VA. Another advantage is that the number of states used in the Viterbi detection is reduced, as shown for a 3×3 transfer matrix in FIG. 6-B. That is, each state S[k,j] can now be a C×D matrix with C=int(M/2)+1, D=N-1; for a 3×3 transfer function, C=D=2. The total number of states for a given k is then 16, rather than 64, as in the VA system illustrated in FIG. 6-A. The computational complexity of the Viterbi step is thus reduced by a factor of four.

The reduced computational complexity is attained at the expense of the memory required to store rows of known bits. On the other hand, the memory required for path storage is smaller for a DF-VA system than for a comparable VA system.

It is clear that in the preceding discussion it would be trivial to interchange rows and columns, or up and down directions. Typical CCD arrays, however, output data row by row from the upper part of the image to the lower part. Therefore, a method of the present invention is preferably implemented with row-by-row Viterbi detection, and decision feedback in the vertical direction.

A method of the present invention is implemented with an apparatus including readout means for reading out signals $\{r_k\}$. The readout means includes a detection array and optics used to manipulate a reconstructed image beam. The detection array preferably includes independently addressable sections. The apparatus also include signal processing means for establishing test states $\{S[k,j]\}$, evaluating metrics $M_p(R)$ for different paths, choosing an optimal path q from the paths p, and for obtaining decoded bits corresponding to the optimal path q. The signal processing means includes multiple channels, each channel being connected to a different section of the detection array.

Preferably, a value is assigned to a bit $d_{k1}$ by determining survivor paths for a given stage k1+w that, with high probability, pass through the same state $S[k1,j]$. The optimal path q then passes through $S[k1,j]$ and $d_{k1}$ is assigned the value $s_{k1,q(k1)}$. The apparatus also preferably comprises decision feedback means for transmitting the values of known bits $\{f_k\}$ to the processing means.

There are many ways to implement a method of the present invention. The following examples are intended to illustrate the invention, and should not be construed to limit the invention.

EXAMPLE 1

The detection process was simulated for typical examples of ISI-corrupted page-access memories. The BER was computed for bit-by-bit threshold detection, VA detection, and DF-VA detection.

Figure 9:
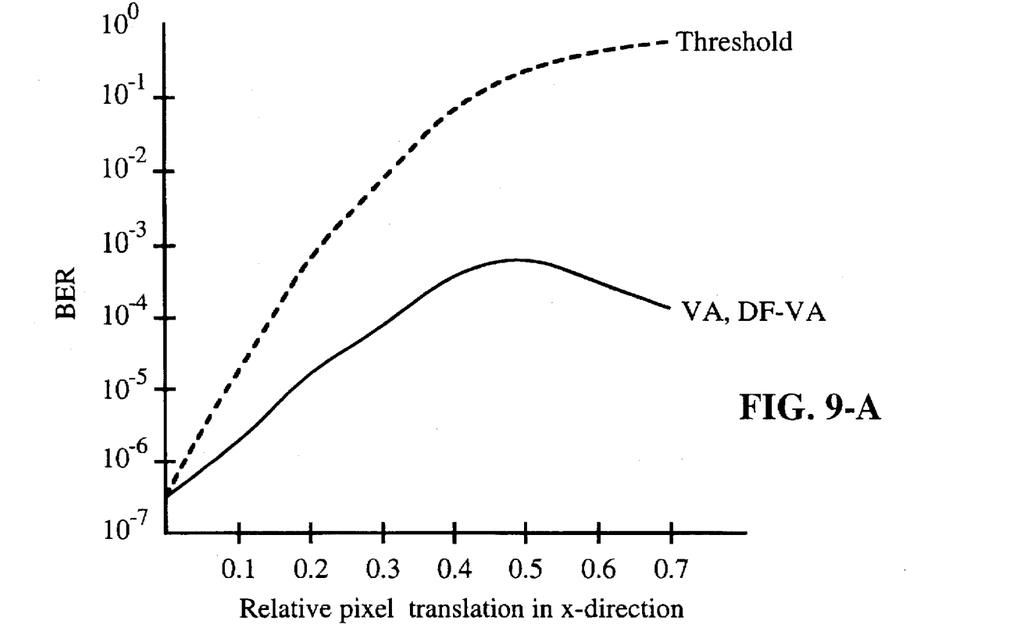

If the readout camera is shifted to the right and down with respect to the input SLM by distances $\delta_x$ and $\delta_y$ respectively, the transfer function is $$h[i,k] = \begin{bmatrix} 0 & 0 & 0 \\ 0 & (1-\delta_x)(1-\delta_y) & \delta_x(1-\delta_y) \\ 0 & (1-\delta_x)\delta_y & \delta_x\delta_y \end{bmatrix}, \quad [9]$$

where i and k mark rows and columns of pixels $a_{i,k}$, respectively. FIGS. 9-A through 9-D show computed BERs for translations in four different directions. The noise is assumed to be additive white Gaussian noise introduced at the detector. The results correspond to a signal-to-noise ratio (SNR) of 20 dB, where the SNR is defined to be $$SNR = 20\log\left(\frac{i_1}{\sigma}\right), \quad [10]$$

with $i_1$ being the signal output in the absence of noise when a 1 is detected, and $\sigma^2$ being the variance of the noise. When the translation is horizontal ($\delta_y=0$), i.e. in the Viterbi direction, the VA and DF-VA detectors clearly outperform the bit-by-bit threshold detector, as shown in FIG. 9-A; DF-VA has no advantage over VA in this case because there is no ISI in the decision feedback (downward) direction. When the translation is in the downward direction, DF-VA outperforms both threshold and VA detection, as shown in FIG. 9-B; the VA detector does not provide much advantage because there is no ISI in the Viterbi detection direction. When the translation is upward, neither VA nor DF-VA gives significantly better performance than threshold detection, as shown in FIG. 9-C. FIG. 9-D shows that the DF-VA and VA detectors outperform a threshold detector if the translation has components in both dimensions, with the DF-VA detector preferred if the vertical translation is in the downward direction.

Figure 10:
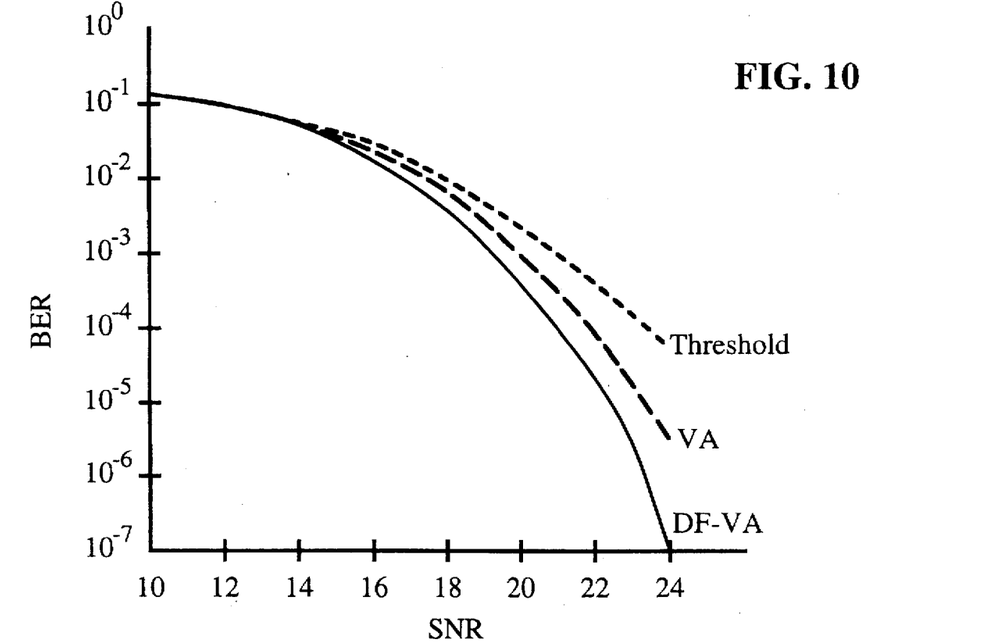
FIG. 10 shows a computed BER as a function of SNR for three detectors, according to the present invention.

Other sources of ISI in page-access optical memories include optical defocusing, aberrations of the optical system, or blooming at the CCD array. In these instances, the transfer function resembles a blur function. FIG. 10 shows the BER as a function of SNR for a system with the transfer function $$h[i,k] = \begin{bmatrix} 0.1 & 0.07 & 0.1 \\ 0.07 & 0.68 & 0.07 \\ 0.1 & 0.07 & 0.1 \end{bmatrix} \quad [11]$$

assuming additive white Gaussian noise. DF-VA detection outperforms both VA and bit-by-bit threshold detection. The differences in BER for the three techniques are most pronounced for large SNR.

EXAMPLE 2

Figure 11:
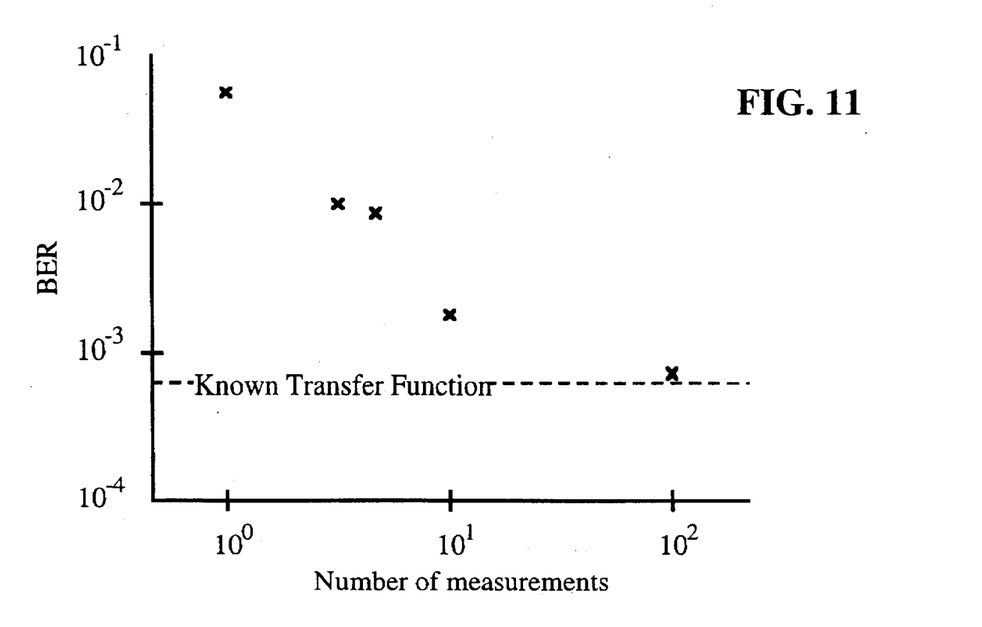
FIG. 11 shows the variation of the BER with the number of (20 dB SNR) measurements used to determine the transfer function h, according to the present invention.

Ideally, a transfer function such as [11] is known a priori with great accuracy. In practice, the transfer function is evaluated empirically for each section. In order to obtain a sufficiently accurate evaluation of the transfer function, multiple observations are preferably performed. FIG. 11 shows a plot of the BER for a DF-VA detector as a function of the number of independent measurements used in estimating h. Each measurement was performed for a different reference portion such as 64. The data corresponds to the transfer function in eq. [11] and a SNR of 20 dB. When enough measurements are performed, the BER approaches that of a system in which the transfer function is known a priori.

EXAMPLE 3

In the above discussion of the detector metric, the additive noise was assumed to obey Gaussian statistics. In practice, the noise may be characterized by non-Gaussian statistics. For example, in scatter-limited holographic storage systems, light intensities are described by Rician distributions. For more information on scatter-limited systems, see the articles by Weaver and Gaylord in *Opt. Eng.*, 20: 404–411 (1981), and Heanue et al. in *J. Opt. Soc. Am. A*, 12: 2432–2439 (1995).

If the probability density in equation [4] is non-Gaussian, minimizing the sum in eq. [5] (the Euclidean metric) is no longer equivalent to maximizing the probability in eq. [3]. The correct metric is difficult to compute because the noise in the signal at a given CCD pixel is correlated with the noise in the signals at surrounding pixels. A Euclidean metric gives adequate performance, however, even in systems with non-Gaussian noise.

Figure 12:
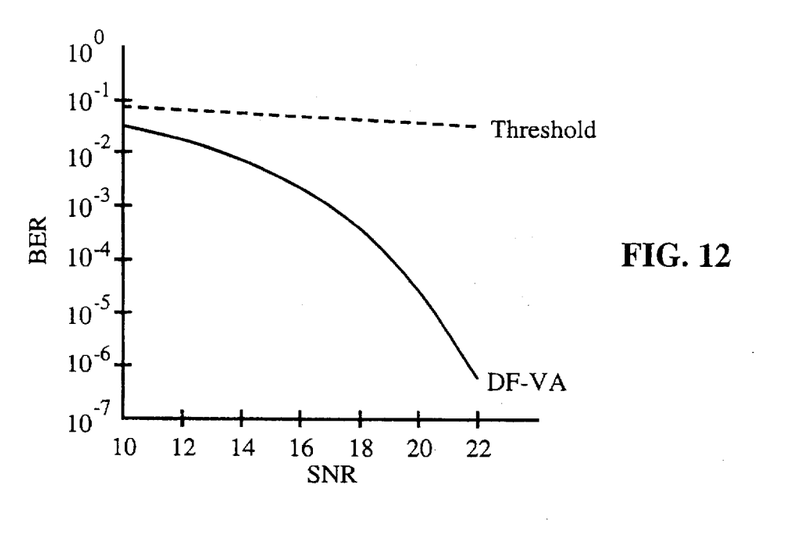
FIG. 12 shows a measured BER as function of SNR for a DF-VA detector, according to the present invention.

FIG. 12 shows the BER performance of a DF-VA detector in a system where noise is introduced in the optical field before input to the filter h. A Euclidean metric is used to evaluate the paths through the trellis. The intensities are taken to be Rician distributed, and the SNR is defined as $10\log(I_1/<I_s>)$, where $I_1$ is the light intensity of a 1 in the absence of noise and $<I_s>$ is the average background intensity due to scatter. The transfer function used is the one in eq. [11]. FIG. 12 shows that VA detection using a Euclidean metric outperforms bit-by-bit threshold detection even when the noise is non-Gaussian. A metric optimized for the noise statistics of the system would lead to further improvements in the BER, however.

EXAMPLE 4

A chrome-on-glass mask (a SLM equivalent) with 512× 512 pixels was imaged onto a CCD array with 1024×1024 pixels. At the CCD array, groups of 2×2 pixels are hardware binned so that the CCD functions as a 512×512 array. Each data bit is represented by a 9 μm×9 μm square on the mask. The center-to-center spacing of the data bits is 18 μm so that each bit is surrounded by a guard band on the mask. Each effective pixel on the CCD is 18 μm×18 μm, with center to center spacings of 18 μm.

The optics are of sufficient quality that each data pixel can be imaged onto one effective pixel on the CCD with minimal ISI. In order to generate ISI, the mask was translated with respect to the CCD array. Both threshold detection and DF-VA detection were evaluated for different translations. The results of two evaluations are shown in Table 1, for 262,144 decoded bits:

TABLE 1

| $\delta_x$ (μm) | $\delta_y$ (μm) | Bit errors (bit-by-bit) | Bit errors (DF-VA) |
|---|---|---|---|
| 0 | 0 | 0 | 0 |
| 5 | 0 | 52,237 | 232 |
| 9 | 0 | 130,376 | 91 |
| 0 | 0 | 2 | 2 |
| 3 | 3 | 455 | 2 |
| 5 | 5 | 45,882 | 90 |

The DF-VA detector is tolerant to relatively large translations, unlike a threshold detector. The transfer functions were determined from knowledge of the translation distances and from measurements of the signals corresponding to reference pixels on the mask. In all cases, the transfer function was assumed to be invariant across the entire page.

Figure 13:
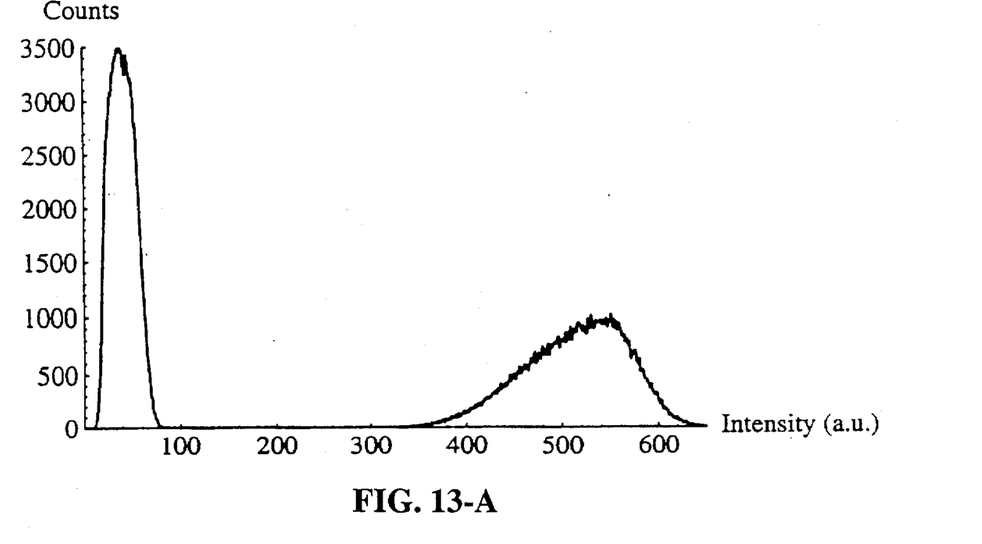

FIGS. 13-A and 13-B show, respectively, histograms of the detected intensities when the mask is aligned with the SLM, and when the mask is translated right 5 μm and down 5 μm. It is evident that threshold detection is incapable of distinguishing many of the zeros and ones in this case. With the same data, the DF-VA detector achieved a BER of $3.4 \times 10^{-4}$, as compared to $1.8 \times 10^{-1}$ for the threshold detector.

The examples above cannot be expected to accurately predict actual BER performance in a system. They are merely intended to give an indication of the ability of a DF-VA detector to compensate for the effects of ISI.

SUMMARY, RAMIFICATIONS, AND SCOPE

There are many ways to implement a decoding methods using Viterbi detection and/or decision feedback, without departing from the spirit of the invention. Therefore, the scope of the invention should be determined not by examples given, but by the appended claims and their legal equivalents.

We claim:

1. A method of obtaining decoded bits $\{d_k\}$ from stored bits $\{b_k\}$ stored in a page-access optical memory, said method comprising the steps of:
   a) reading out from said memory a set R of signals $\{r_k\}$ corresponding to bits $\{b_k\}$;
   b) establishing test states $\{S[k,j]\}$, each test state $S[k,j]$ including a test bit $s_{k,j}$ and at least one additional test bit $s_{k+z,j}$;
   c) evaluating a metric $M_p(R)$ for a set of paths $\{p\}$ of test states $\{S[k,j]\}$, each path p defining a unique value of j for each value of k, each path p comprising test states $\{S[k,p(k)]\}$, each test state $S[k,p(k)]$ comprising a test bit $s_{k,p(k)}$;
   d) choosing an optimal path q comprising part of at least one path p, said choosing being performed such that the evaluated metric $M_q(R)$ for said path q is optimal; and
   e) obtaining decoded bits $\{d_k\}=\{s_{k,q(k)}\}$.

2. The method of claim 1, wherein each test state $S[k,j]$ further comprises at least one known bit $f_k$.

3. The method of claim 1, wherein obtaining a decoded bit $d_{k1}$ comprises the steps of:
   a) determining survivor paths $\{p^{(s)}[k1+w,j]\}$ entering states $\{S[k1+w,j]\}$, survivor paths $\{p^{(s)}[k1+w,j]\}$ passing through at least one of states $\{S[k1,j]\}$;
   b) selecting a path entering a state $S[k1,q(k1)]$ as said optimal path q, said optimal path q comprising a portion common to a plurality of survivor paths $\{p^{(s)}[k1+w,j]\}$; and
   c) assigning $d_{k1}=s_{k1,q(k1)}$.

4. The method of claim 3, wherein w is larger than or equal to 5L, L being an intersymbol memory length for said page.

5. The method of claim 1, wherein each state $S[k,j]$ comprises C×D test bits $\{s_{c,d}\}$.

6. The method of claim 5, wherein each test state $S[k,j]$ further comprises at least one known bit $f_k$, and wherein C=2 and D=3.

7. The method of claim 1, wherein said bits $\{b_k\}$ correspond to a row i of pixels $\{a_{i,k}\}$.

8. The method of claim 7, each test state $S[k,j]$ further comprising at least one known bit $f_k$, said known bit $f_k$ corresponding to a pixel $a_{i+v,k}$.

9. The method of claim 8, wherein $v=\pm 1$.

10. The method of claim 1, wherein said metric $M_p(R)$ is a function of a set of ideal outputs $\{t_{k,p(k)}\}$ corresponding to test bits $\{s_{k,p(k)}\}$.

11. The method of claim 10, wherein said metric $M_p(R)$ comprises the Euclidean distance between said set R and said set of ideal outputs $\{t_{k,p(k)}\}$.

12. The method of claim 10, wherein determining said ideal outputs comprises measuring a set of signals from a reference page, said reference page comprising pairs of states $\{S[k1,j1],S[k1+1,j2]\}$ for all j1, j2.

13. The method of claim 10, wherein determining said ideal outputs $\{t_{k,p(k)}\}$ comprises applying a transfer function h to test states $\{S[k,p(k)]\}$.

14. The method of claim 13, wherein said transfer function h comprises M×N elements.

15. The method of claim 14, wherein M=3 and N=3.

16. A method of obtaining decoded bits $\{d_k\}$ from stored bits $\{b_k\}$ stored in a page-access optical memory, said method comprising the steps of:
   a) reading out from said memory a signal $r_k$ corresponding to a bit $b_k$, said signal $r_k$ depending on said bit $b_k$ and on a known bit f;
   b) obtaining a processed signal $g_k$ by subtracting from said signal $r_k$ a transfer factor, said transfer factor being proportional to said known bit f and to a transfer coefficient $h(f,b_k)$;
   c) obtaining a decoded bit $d_k$ directly from said processed signal $g_k$.

17. The method of claim 16, wherein said transfer coefficient $h(f,b_k)$ is set equal to a second transfer coefficient $h(B1,B2)$, B1 and B2 being known bits.

18. The method of claim 17, a page of said memory comprising a plurality of sections, said bits f, $b_k$, B1 and B2 belonging to one of said plurality of sections.

19. The method of claim 18, wherein each of said plurality of sections is separated from another of said plurality of sections by a buffer zone, said buffer zone comprising known bits.

20. An apparatus for obtaining decoded bits $\{d_k\}$ from stored bits $\{b_k\}$ stored in a page-access optical memory, said apparatus comprising:

a) readout means for reading out from said memory a set R of signals $\{r_k\}$ corresponding to bits $\{b_k\}$; and b) signal processing means for:
  1. establishing test states $\{S[k,j]\}$, each test state $S[k,j]$ including a test bit $s_{k,j}$ and at least one additional test bit $s_{k+z,j}$;
  2. evaluating a metric $M_p(R)$ for a set of paths $\{p\}$ of test states $\{S[k,j]\}$, each path p defining a unique value of j for each value of k, each path p comprising test states $\{S[k,p(k)]\}$, each test state $S[k,p(k)]$ comprising a test bit $s_{k,p(k)}$;
  3. choosing an optimal path q comprising part of at least one path p, said choosing being performed such that the evaluated metric $M_q(R)$ for said path q is optimal; and
  4. obtaining decoded bits $\{d_k\}=\{s_{k,q(k)}\}$.

21. The apparatus of claim 20, wherein obtaining a decoded bit $d_{k1}$ comprises the steps of:

a) determining survivor paths $\{p^{(s)}[k1+w,j]\}$ entering states $\{S[k1+w,j]\}$, survivor paths $\{p^{(s)}[k1+w,j]\}$ passing through at least one of states $\{S[k1,j]\}$;

b) selecting a path entering a state $S[k1,q(k1)]$ as said optimal path q, said optimal path q comprising a portion common to a plurality of survivor paths $\{p^{(s)}[k1+w,j]\}$; and c) assigning $d_{k1}=s_{k1,q(k1)}$.

22. The apparatus of claim 20, further comprising decision feedback means for transmitting to said processing means known bits $\{f_k\}$, each state $S[k,j]$ further comprising at least one known bit $f_k$.

23. The apparatus of claim 20, wherein said readout means comprises a detector array having independently addressable sections.

* * * * *

UNITED STATES PATENT AND TRADEMARK OFFICE
CERTIFICATE OF CORRECTION

PATENT NO.    : 5,740,184
DATED         : April 14, 1998
INVENTOR(S)   : Heanue, John F. et al.

It is certified that error appears in the above-identified patent and that said Letters Patent is hereby corrected as shown below:

<u>Column 7,</u>
Line 3, please insert -- This invention was made with U.S. Government support under Contract No. MDA 972-94-Z-008, awarded by the ARPA PRISM Program. The U.S. has certain rights in this invention. --

Signed and Sealed this

Fourteenth Day of January, 2003

JAMES E. ROGAN
*Director of the United States Patent and Trademark Office*